(12) United States Patent
Blednov (10) Patent No.: US 7,884,668 B2
(45) Date of Patent: Feb. 8, 2011

(54) INTEGRATED DOHERTY TYPE AMPLIFIER ARRANGEMENT WITH HIGH POWER EFFICIENCY

(75) Inventor: Igor Blednov, Nijmegen (NL)

(73) Assignee: NXP B.V., Eindhoven (NL)

( * ) Notice: Subject to any disclaimer, the term of this patent is extended or adjusted under 35 U.S.C. 154(b) by 402 days.

(21) Appl. No.: 11/631,206

(22) PCT Filed: Jun. 28, 2005

(86) PCT No.: PCT/IB2005/052131

§ 371 (c)(1),
(2), (4) Date: Feb. 25, 2009

(87) PCT Pub. No.: WO2006/003608

PCT Pub. Date: Jan. 12, 2006

(65) Prior Publication Data

US 2009/0212858 A1     Aug. 27, 2009

(30) Foreign Application Priority Data

Jun. 29, 2004   (EP) ................................. 04103046

(51) Int. Cl.
*H03F 3/68* (2006.01)
(52) U.S. Cl. ...................... 330/124 R; 330/295; 330/53
(58) Field of Classification Search ............. 330/124 R, 330/295, 53
See application file for complete search history.

(56) References Cited

U.S. PATENT DOCUMENTS

| | | | |
|---|---|---|---|
| 5,420,541 A | 5/1995 | Upton et al. | |
| 6,085,074 A | 7/2000 | Cygan | |
| 6,124,742 A * | 9/2000 | Cook et al. | 327/119 |
| 6,262,629 B1 | 7/2001 | Stengel et al. | |
| 6,737,922 B2 * | 5/2004 | Pengelly et al. | 330/295 |
| 7,145,387 B2 * | 12/2006 | Hellberg | 330/124 R |
| 7,345,535 B2 * | 3/2008 | Kwon et al. | 330/124 R |

(Continued)

FOREIGN PATENT DOCUMENTS

CN    1279842 A    1/2001

(Continued)

OTHER PUBLICATIONS

Doherty, W.H. "A New High Efficiency Power Amplifier for Modulated Waves," Proc. of the Inst. of Radio Engineers, vol. 24, No. 9 (Sep. 1936).

(Continued)

*Primary Examiner*—Patricia Nguyen (57) ABSTRACT

The present invention relates to an integrated Doherty type amplifier arrangement and an amplifying method for such an arrangement, wherein a lumped element hybrid power divider (12) is provided for splitting input signals of main and peak amplifier stages (20, 30, 40) at predetermined phase shifts and non-equal division rates and at least one wideband lumped element artificial line (Z 1, Z2) combined with wideband compensation circuit for receiving said first amplified signal and for applying said predetermined phase shift to said first amplified signal and its higher harmonics. Thereby, the low gain of the peak amplifier is compensated by providing the non-equal power splitting at the input. Moreover, the use of the lumped element hybrid power divider leads to an improved isolation between the input ports of the main and peak amplifiers decreasing final distortions of the output signal.

11 Claims, 8 Drawing Sheets

U.S. PATENT DOCUMENTS

| | | |
|---|---|---|
| 7,427,895 B1 * | 9/2008 | Okubo et al. ........... 330/124 R |
| 7,486,136 B2 * | 2/2009 | Bakalski et al. ......... 330/124 R |
| 2002/0093383 A1 | 7/2002 | Thompson |
| 2002/0186079 A1 | 12/2002 | Kobayashi |
| 2003/0076167 A1 | 4/2003 | Hellberg |
| 2003/0137346 A1 | 7/2003 | Hellberg |
| 2004/0119533 A1 | 6/2004 | Kwon et al. |

FOREIGN PATENT DOCUMENTS

| | | |
|---|---|---|
| CN | 1489827 A | 4/2004 |
| WO | 99/27645 A1 | 6/1999 |
| WO | 02/47259 A1 | 6/2002 |
| WO | 2004/100358 A1 | 11/2004 |

OTHER PUBLICATIONS

Tongchoi, C. et al. "Lumped Element Based Doherty Power Amplifier Topology CMOS Process," IEEE, pp. I-445 to I-448 (2003).

* cited by examiner

INTEGRATED DOHERTY TYPE AMPLIFIER ARRANGEMENT WITH HIGH POWER EFFICIENCY

The present invention relates to an integrated Doherty type amplifier arrangement and a method of amplifying an input signal of such a Doherty type amplifier arrangement.

In recent years, there has been a strong demand to improve the efficiency of power amplifiers for wireless communications. The use of the Doherty technique allows to maintain the efficiency of the power amplifier across a wide range of input power variation. The Doherty amplifier was first suggested by W. H. Doherty in 1936 and is discussed in a technical paper and titled "A New High Efficiency Power Amplifier For Modulated Waves", W. H. Doherty, Proceedings of the Institute of Radio Engineers, Vol. 24, No. 9, September 1936. Originally intended for use in low to medium frequency amplitude modulated broadcasting transmitters, the suggested scheme can be modified and updated to increase efficiency of high frequency power amplifiers.

In a conventional amplifier there is a direct relationship between efficiency and input drive level. Therefore, high efficiency is not attained until the high frequency input power becomes sufficiently high to drive the amplifier into saturation. Since in multi-carrier communications systems an amplifier must remain as linear as possible in order to avoid intermodulation distortion, this region of high efficiency cannot be used.

The Doherty amplifier schema achieves high linear efficiency by having a first amplifier (main amplifier or carrier amplifier) operated at a point where the output begins to saturate and where the highest linear efficiency is obtained. Additionally, a second amplifier (peak amplifier or auxiliary amplifier) is used to affect the first so that overall linearity can be maintained as it is driven beyond this saturation point. The Doherty amplifier's operation can thus be divided into two main regions. In the first region, the input power is less than the peak amplifier's threshold and only the carrier amplifier supplies the output power to the load with the efficiency determined by its mode of operation, i.e. AB-class, B-class, F-class or E-class, which defines the location of the bias working point of the amplifier. As the input drive voltage or power increases further to a level just before the carrier amplifier becomes saturated, i.e. the point where the peak efficiency is obtained, the peak amplifier starts to operate and this mark is the beginning of the second region. Through the connection of a quarter-wave transformer, the power supplied by the peak amplifier effectively reduces the output load impedance seen by the carrier amplifier. This impedance reduction enables the carrier amplifier to deliver more power to the load while its voltage remains saturated. In this way, the maximum efficiency of the carrier amplifier and hence the overall Doherty amplifier is maintained throughout the region until the peak amplifier reaches its saturation. However, variable input impedances of the power devices especially when used in C-class operating mode (with bias providing conducting angle less that 180 degrees), which is often the case for the peak amplifier, lead to amplitude and phase distortions depending on the power level, which its extremely detrimental for code multiplex system, such as Wideband Code Division Multiple Access (WCDMA) communication systems. Furthermore, the variable input impedances lead to power reflections from the input of the power devices operating in the peak and main amplifiers and this results in an undesirable mutual influence or coupling effect.

On one hand, the Doherty technique requires use of similar devices in the carrier (or main) and peak amplifiers to provide best linearity, but, on the other hand, both power devices are operating in different modes, e.g. the main amplifier in AB-class and the peak amplifier in C-class, which cause large differences in power gain. Thus, the Doherty amplifier's characteristic comprises a power range where the gain starts to decrease and thus introduces increased output amplitude modulations based on input amplitude modulations (i.e. AM-AM distortions) due to the fact that the peak amplifier operating in C-class has a lower gain and the load impedance at the main amplifier output drops due to the Doherty principal.

Another bottleneck of the Doherty amplifier results from required 90° lines at the input and output of the Doherty amplifier, which cause a limited frequency band of operation.

In view of the above drawbacks, improvements of the Doherty performance are required to achieve an electrical isolation between the input ports of the peak and main amplifiers and between the common Doherty input and the respective inputs of the peak and main amplifiers. Furthermore, a wideband 90° phase difference between the two signals applied to the main and peak amplifier inputs is desirable.

Moreover, as the Doherty amplifier technique is specifically addressed to wideband cellular communications systems, an integrated solution (MMIC) which can be used as mobile phone output amplifier and which can withstand severe impedance mismatches at the output side (voltage standing wave ratios (VSWR) of 1:10, for example) is desirable.

In the article "Lumped Element Based Doherty Power Amplifier Topology CMOS Process", C. Tongchoi et al, IEEE, 2003, pp I-445 to I-448, a CMOS (Complementary Metal Oxide Semiconductors) microwave Doherty power amplifier is described, which maintains high power-added efficiency over a wide range of output power. The implementation is based on a combination of AB-class and C-class CMOS power amplifiers where the quarter-wave transformers are realized using lumped-element LC equivalents for high efficiency and compact design. Moreover, to minimize the inherently high substrate loss and further increase the level of integration, a quadrature 3-dB hybrid circuit, which splits the input signal equally but 90° different in phase to the main and peak amplifiers, is also substituted by its lumped equivalents. In particular, the quarter-wave transformer and the branch-line coupler are represented by π-type lumped-element equivalent circuits consisting of series inductors and parallel capacitors, which provides the advantage that inevitable parasitic capacitances associated with the bonding pads and the package can be absorbed into the parallel capacitors. The capacitors are suggested to be of a square type Metal-Insulator-Metal (MIM) structure, while all inductors are suggested to be integrated planar spiral inductors.

However, the above document does not address the above problems resulting from the mutual coupling due to variable input impedance and variable output loading of the main and peak amplifiers in the Doherty amplifier arrangement.

It is therefore an object of the present invention to provide an improved Doherty amplifier arrangement, by means of which a compact design with high isolation between all ports at arbitrary power division and wideband 90° phase shift between the divided signals can be obtained.

This object its achieved by an integrated Doherty type amplifier arrangement as claimed in claim 1 and by a method of amplifying an input signal, corresponding to claim 1.

Accordingly, the low gain of the peak amplifier is compensated by providing a non-equal power splitting at the input. Moreover, the use of the lumped element hybrid power divider leads to an improved isolation between the input ports of the main and peak amplifiers. Additionally, the hybrid power divider can provide the required power distribution between the main and peak amplifiers to thereby optimize linearity versus efficiency.

The main and peak amplifiers stages may comprise at least one of bipolar elements, metal oxide semiconductors, field effect transistors /MOS or LDMOST/ and HBT elements. All these elements assure that the proposed Doherty type amplifier arrangement can be kept compact in size.

The lumped element hybrid power divider means may be built with bond wires or deposited inductances and capacitances. The use of bond wires provides the advantage that power loss is avoided in the lumped elements. On the other hand, the use of deposited capacitances provides the advantage that parasitic capacitances can be considered or intergrated as a part of the lumped elements. In general, both solutions serve to shrink the circuit size for integration.

The main amplifier and peak amplifier stages may comprise an output compensation circuit for compensating parasitic output capacitances at fundamental frequency and odd multiples thereof, e.g., the threefold of the fundamental frequency. This measure serves to suppress harmonic frequencies of the fundamental frequency at the output of the amplifier arrangement. Additionally, the output compensation circuit may be adapted to provide a substantially reduced impedance at even multiples of fundamental frequency. In particular, the output compensation circuit may comprise two inductors and two capacitors or their equivalents. The inductors of the output compensation circuit may be at least partly made of bond wires. Again, this provides the advantage of reduced power loss, especially at higher harmonics of the fundamental.

Furthermore the main and the least one peak amplifier stages may be connected at their outputs via the lumped element artificial line which acts as a quarter wavelength transmission line. The lumped element equivalent of the transmission line provides a wide range of characteristic impedance without impact on area required. Specifically, the lumped element artificial line comprises two or more inductively coupled wires and one or more capacitors connected with its one and two a common point of the two of said inductively coupled wires and with its other end to a reference potential.

The lumped element hybrid power divider means may be arranged to provide isolation between all ports at arbitrary power division and to substantially maintain the predetermined phase shift between the first and at least one second signal over a wide frequency range. Thereby, mutual coupling between the input ports of the main and peak amplifier stages can be prevented. In particular, the lumped element hybrid power divider comprises at each input port a respective serial inductor and two first parallel capacitors connected to each other at their one ends via the serial inductor and connected at their other ends to a reference potential, and two second parallel capacitors respectively connecting the ends of the respective serial inductors.

The present invention will now be described based on a preferred embodiment with reference to the accompanying drawings, in which.

The preferred embodiment will now be described in connection with an MMIC (Monolithic Microwave Integrated Circuit) Technology, which may be used in a transceiver design of a wireless system or any other radio frequency (RF) system. The application of MMIC technology has enabled miniaturization of microwave and millimeter-wave systems, combined with increasing performance.

In mobile RF transceivers of emerging wireless systems such as WCDMA, CDMA2000 or Wireless Local Area Network (WLAN) systems according to the IEEE 802.11 (a)/(g) standard, power amplifiers are used in transmitter stages, where the modulated RF signal is amplified before being supplied to the antenna for wireless transmission. These power amplifiers are the most power consuming part of these RF transceivers. Using a Doherty type amplifier arrangement, a highly efficient power amplifier can be provided.

In the power amplifier arrangement according to the preferred embodiment a Doherty structure is used, where circuit size is reduced for integration by using lumped elements to replace distributed circuit like power splitters and transmission lines. Furthermore, inductive coupling is used to increase inductance values and output parasitic capacitances are used as a part of lumped element artificial lines. Moreover, to avoid power losses in lumped elements and provide stable characteristic impedance in a wide frequency band including 2fo . . . nfo harmonics of fundamental signal, bond wires are suggested to be used as inductances. Bondwires provide very high parasitic parallel resonance frequency, e.g. above 15 GHz, as lumped inductance suitable for building a wideband lumped element equivalent of an RF transmission line.

Figure 1:
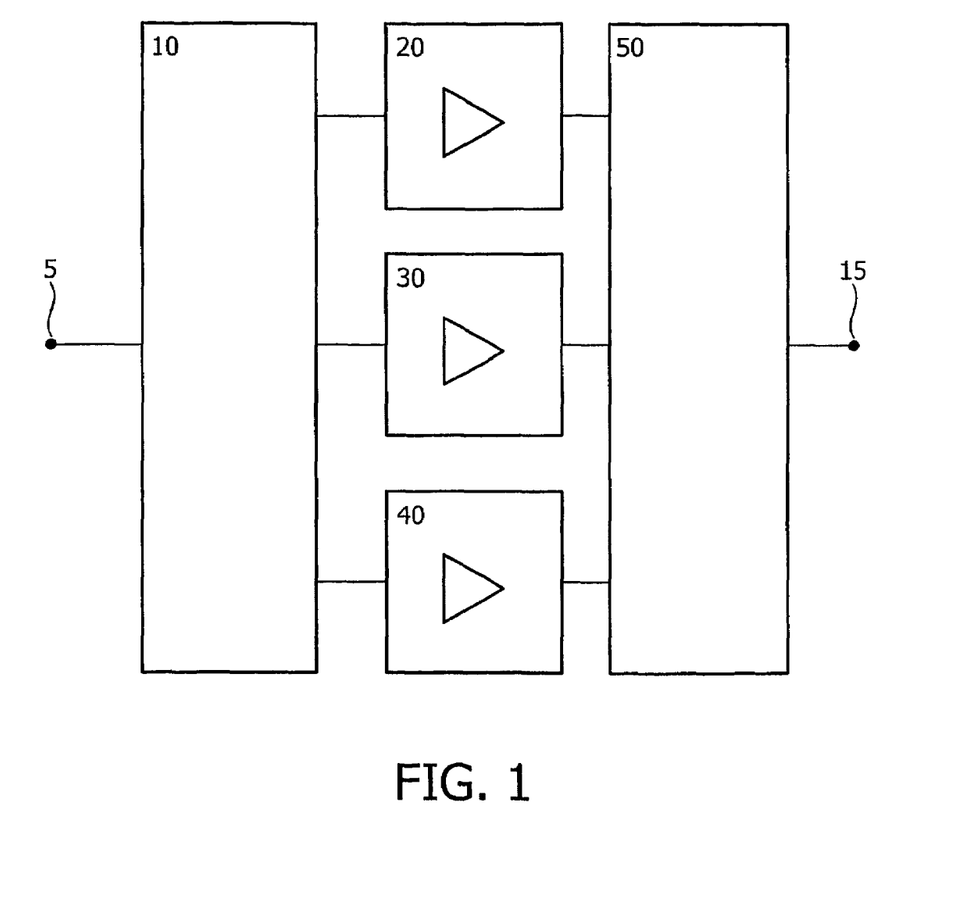
FIG. 1 shows a schematic block diagram of a Doherty type amplifier arrangement according to the preferred embodiment.

FIG. 1 shows a schematic block diagram of Doherty type amplifier arrangement, where an input signal received at an input terminal 5 is supplied to an input network 10 in which lumped element hybrid power dividers are provided for splitting the input signal to a carrier or main amplifier 20 and at least one peak amplifier 30, 40. In the present example of FIG. 1, two peak amplifiers 30, 40 are used to support the operation of the main amplifier 20. The output signals of the main amplifier 20 and the two peak amplifiers 30, 40 are supplied to an output network which comprises a predetermined number of lumped element artificial lines which number corresponds to the number of peak amplifiers 30, 40. Thus, in the present example of FIG. 1, two lumped element artificial lines are provided in the output network 50. The output network 50 serves to combine the output signals of the main and peak amplifiers so as to generate a single amplified output signal supplied to an output terminal 15.

To compensate for the low gain of the peak amplifiers 30, 40 which may operate in C-class mode, i.e. at a negative input bias, non-equal power splitting is performed in the input circuit 10. Furthermore, to diminish the effect of variable input impedance of the peak amplifiers 30,40, hybrids are used in the input network 10 to provide enhanced isolation between the ports of the input network 10.

The linearity versus efficiency characteristic of the Doherty type amplifier arrangement can be optimized by using a phase control at the input of the main and peak amplifiers 20, 30, 40 and by using dynamic bias voltages to control the peak amplifiers 30, 40. The required power distribution can be provided by establishing the non-equal power division at the hybrids of the input network 10.

Figure 2:
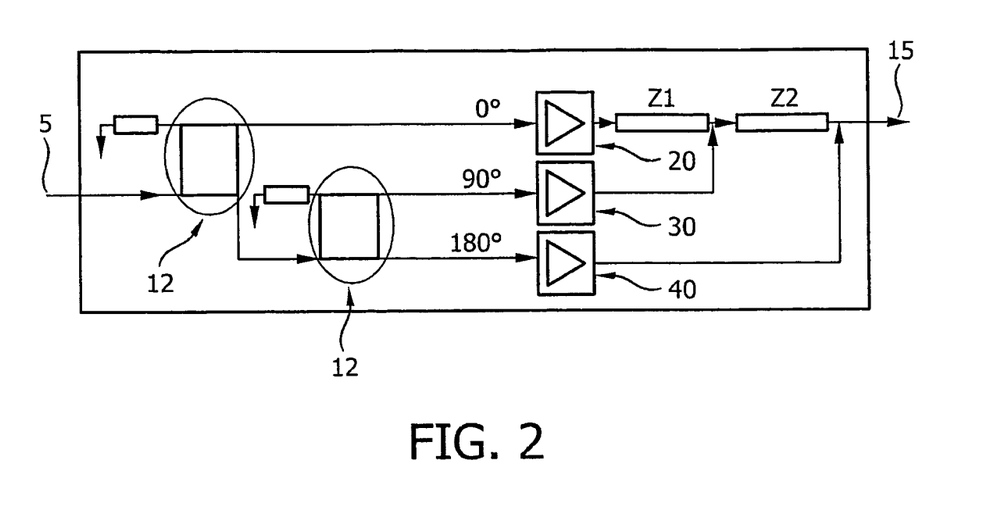
FIG. 2 shows a schematic circuit diagram of the Doherty type amplifier arrangement with two parallel peak amplifiers, according to the preferred embodiment.

FIG. 2 shows a circuit diagram of the above two-stage integrated Doherty type amplifier in MMIC technology. The input network 10 consists of two lumped element hybrid couplets 12, each having two input and two output ports. The upper input port of each hybrid coupler 12 is grounded via a predetermined load resistor which may correspond to the characteristic impedance of the line system, e.g. a strip line or micro strip system. The input signal at the input port 5 its supplied to the lower input port of the first hybrid coupler 12 which upper output port is connected at a 0° phase shift to the main amplifier 20, while its lower output port is connected a 90° phase shift to the lower input port of the second hybrid coupler 12. The upper output port of the second hybrid coupler 12 is connected at the 90° phase shift to the first peak amplifier 30, while the lower output port of the second hybrid coupler 12 is connected at a 180° phase shift to the second peak amplifier 40. The power distribution network with the two hybrid couplers 12 can provide an arbitrary power division between the main amplifier 20 and the peak amplifier 30, 40, which allows flexibility in optimization of the Doherty performance.

Before combining the output signals of the main amplifier 20 and the peak amplifiers 30, 40 again, the output signal of the main amplifier 20 is matched in phase by two serially connected λ/4 transmission lines Z1 and Z2, after which the respective output signals of the peak amplifiers 30 and 40 are combined with suitably delayed output signal of the main amplifier 20 to generate the combined output signal available at the output terminal 15.

The main amplifier 20 and the two peak amplifiers 30, 40 each may comprise a power device in bipolar technology, MOS (Metal Oxide Semiconductor) technology, LDMOST (Lateral Defused Metal Oxide Semiconductor Transistor) technology, FET (Field Effect Transistor) technology, or HBT (Heterojunction Bipolar Transistor) technology. The LDMOST technology provides high gain and good linearity compared to the other semiconductor technologies. However, complex modulation schemes, like WCDMA, make further device improvements for linearity still very desirable. Therefore, the suggested Doherty type amplifier arrangement enhances the performance of the LDMOST technology or other RF power devices technologies mentioned above. For example, HBT MMIC power devices may be used, where the heterojunction increases breakdown voltage and minimizes leakage current between junctions.

Figure 3:
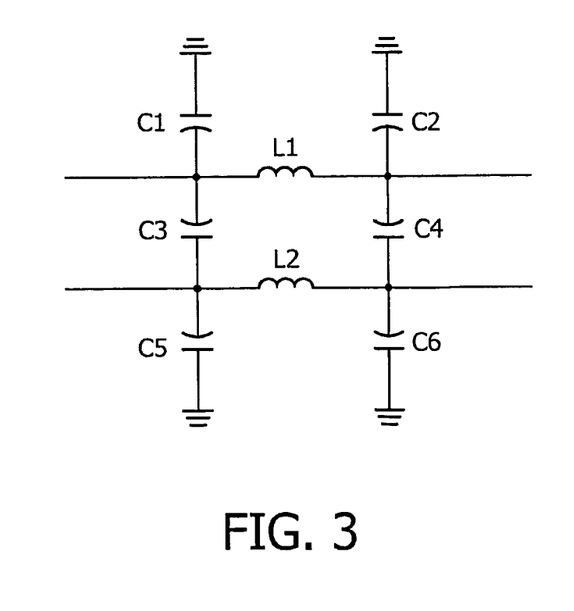
FIG. 3 shows a circuit diagram of a lumped element hybrid coupler with non-equal power division according to the preferred embodiment.

FIG. 3 shows a lumped element configuration of the hybrid couplers 12 of FIG. 2. According to FIG. 3, the hybrid couplers 12 comprise parallel capacitors C3 and C4 connected between the two input ports and the two output ports, wherein one of the input ports (lower input port in FIG. 3 and upper input port in FIG. 2) is used as a termination port to which external load is connected. This external load relieves the power dissipation constraint, since the mismatch-derived power does not have to be internally dissipated, as is the case with in-phase dividers/combiners. The capacitors C3 and C4 connected in parallel to the two input-side ports and the two output-side ports, respectively are connected at their upper ends via a first serial inductor L1, and at their lower ends via a second serial inductor L2. Each port is connected via third parallel capacitors C1, C2, C5 and C6 to ground or any other suitable reference potential. With this configuration, it is possible to provide an arbitrary, specifically non-equal, power division at the first and second output ports while the phase shift between the output signals at the two output ports remains constant at 90° over a wide frequency range. Moreover, a high isolation between the two output ports can be achieved also over a wide frequency range. Thereby, the required power division between the main amplifier 20 and the peak amplifiers 30 and 40 can be provided, while input reflection losses can be kept low. Of course, this advantage is also achieved in case of a single-stage Doherty type amplifier with only one peak amplifier, e.g. the upper peak amplifier 30.

Figure 4:
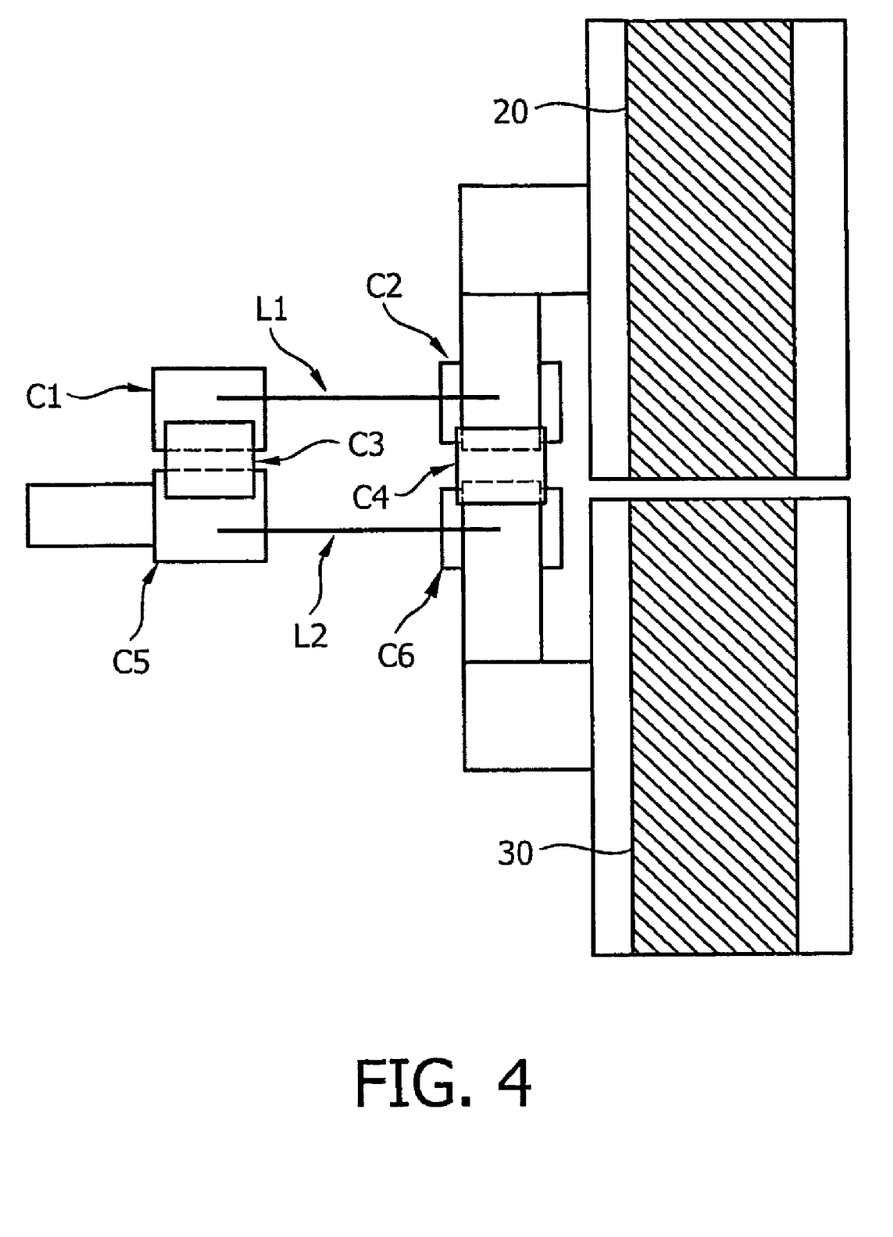
FIG. 4 shows an implementation example of the lumped element hybrid coupler of FIG. 3.

FIG. 4 shows an MMIC implementation example of the lumped element hybrid configuration of FIG. 3. The input signal is supplied to the terminal on the left side of FIG. 4, wherein the plate-like structures correspond to the capacitors C1 to C6 and the bold lines correspond to bond inductors L1 and L2. The overlapping plate-like structures correspond to the capacitors C3 and C4 which connect the respective end-points of the bond inductors L1 and L2. The upper bond inductor L1 supplies the first part of the input signal to the 0° port which is connected to the input terminal of the main amplifier 20. The lower bond inductor L2 supplies the second part of the input signal to the 90° port which is connected to the input terminal of the first peak amplifier 30. A compact circuit design can thus be achieved.

Figure 5:
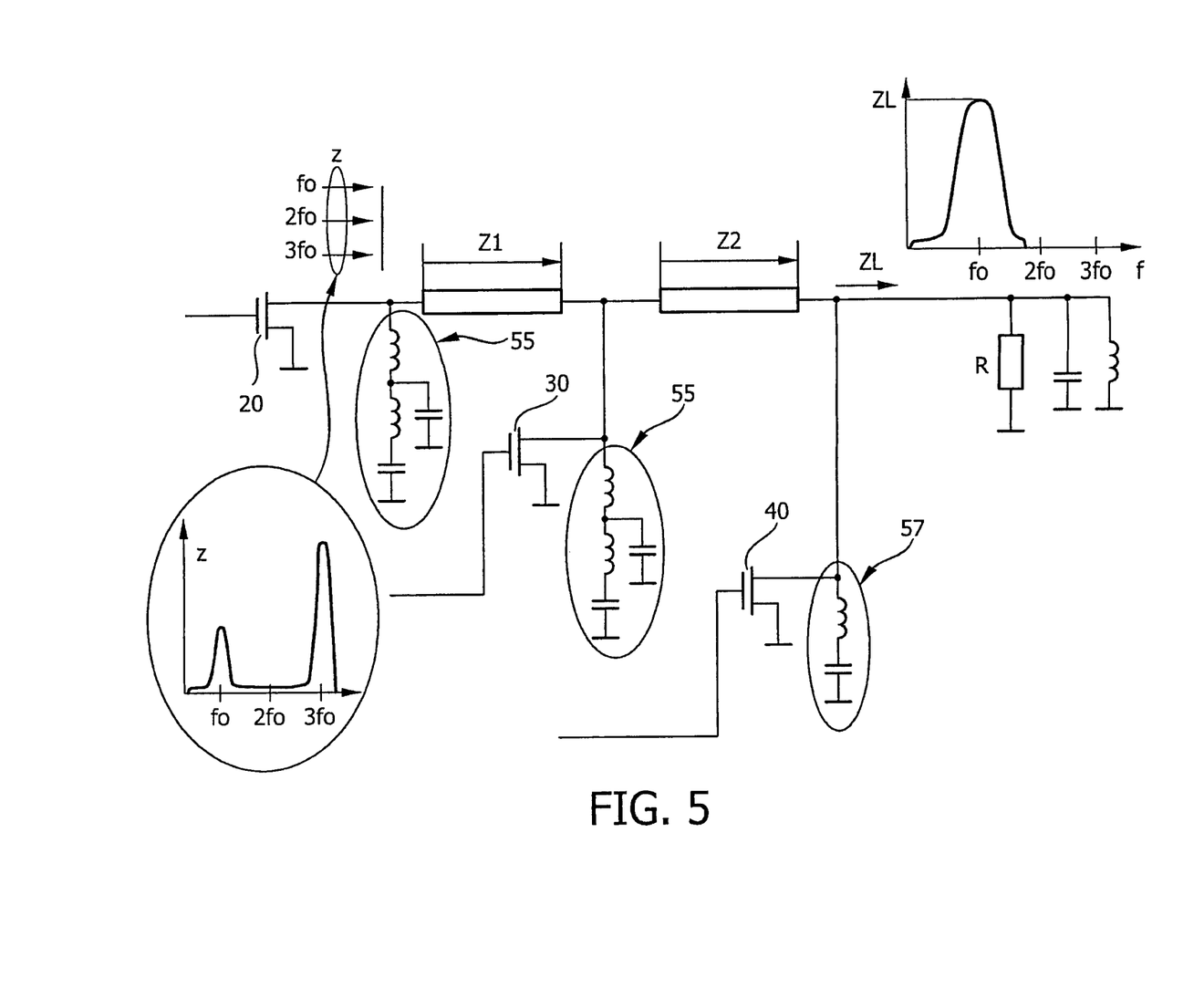
FIG. 5 shows an output circuitry for an integrated Doherty type amplifier arrangement according to the preferred embodiment.

FIG. 5 shows a schematic circuit diagram of the output network 50 for the integrated Doherty type amplifier. As can be gathered from FIG. 5, dedicated compensation circuits 55 and 57 are provided at the output of the respective power devices of the main amplifier 20 and the peak amplifiers 30, 40. The first compensation circuit 55 serves to compensate the output capacity Co at the output of the power devices specifically at fundamental frequency fo and odd multiples thereof, e.g., 3fo. The two lumped element transmission lines Z1 and Z2 are adapted to show required Zo and λ/4 wavelength line characteristic at the fundamental frequency fo, a λ/2 wavelength line properties at 2fo and a 3λ/4 wavelength line performance at 3fo. In combination with these lumped element transmission lines Z1, Z2 and the load impedance ZL at the output, the first compensation circuits 55 serve to provide an impedance Z corresponding to the characteristic impedance Zo at the fundamental frequency fo, a small impedance corresponding to a short circuit at 2fo, and a high impedance corresponding to an open circuit at 3fo. This is indicated in the lower left of FIG. 5 as a frequency characteristic of the impedance Z. The second compensation circuit 57 at the output of the second peak amplifier 40 consists of a serial connection of an inductor and a capacitor and serves to provide a characteristic where the load impedance ZL is selectively provided at fundamental frequency fo.

Figure 6:
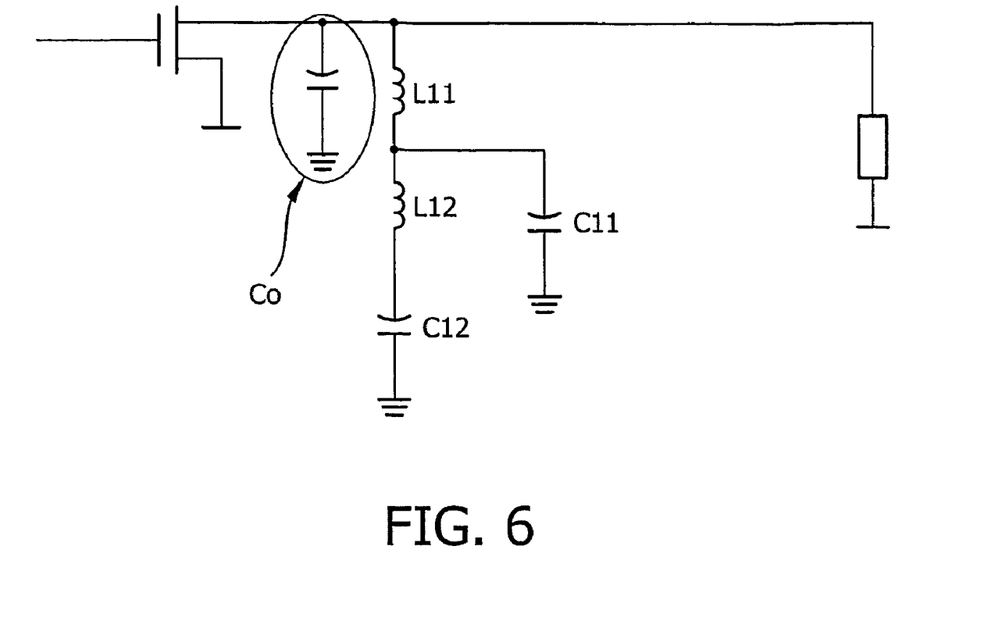
FIG. 6 shows a compensation circuit used in the output circuitry according to the preferred embodiment.

FIG. 6 shows a circuit diagram indicating the first compensation circuit 55 with the parasitic output capacitance Co of the respective preceding amplifier circuit. In particular, the first compensation circuit 55 consist of two serial inductors L11 and L12 and one serial capacitor C12, where a parallel capacitor C11 is connected between the junction point of the two serial inductors and ground or reference potential.

Figure 7:
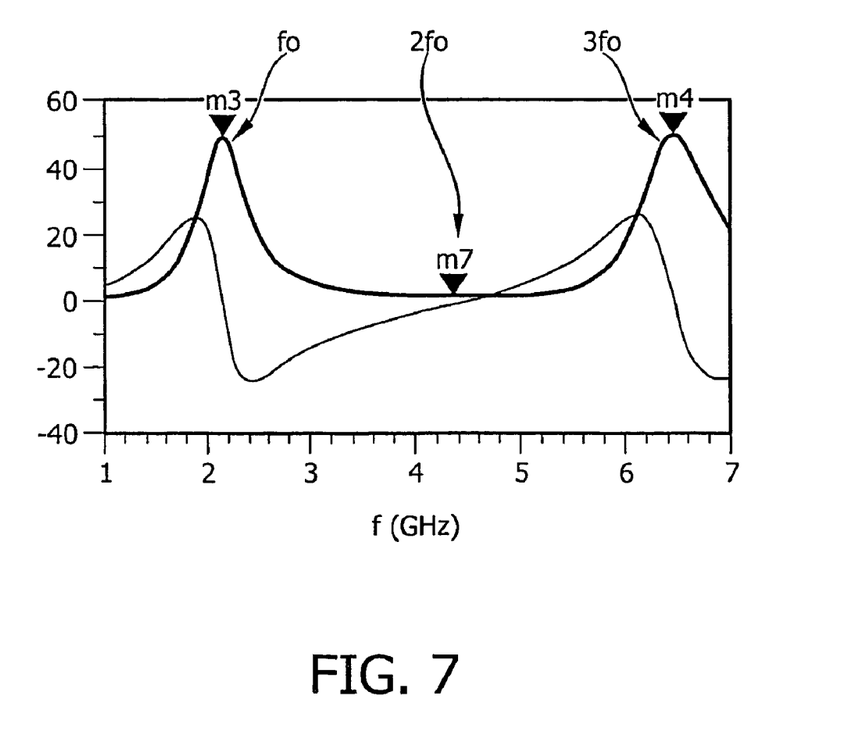
FIG. 7 shows a spectral diagram of the real part and imaginary part of the impedance of the output circuit.

FIG. 7 shows a frequency characteristic of the real part (upper positive curve) and imaginary part (lower positive and negative curve) of the impedance Z of the first compensation circuit 55 shown in FIG. 6. As can be gathered from FIG. 7, an adaptation to the load impedance ZL (e.g. 50 Ohm) is provided selectively at the fundamental frequency fo and the threefold of the fundamental frequency 3fo. At these frequency points, the imaginary part of the impedance is zero. Furthermore, at the twofold fundamental frequency 2fo, both real part and imaginary part of the impedance are substantially zero, which corresponds to a short circuit, so that the twofold fundamental frequency 2fo is blocked by the first compensation circuit 55. This arrangement provides a rejection of 2fo harmonics power at the output of main and peak amplifiers which are the root cause of intermodulation distortions. Also a compensation of output capacitance of main and peak power devices at 3fo together with $\lambda/4$ lines provide a high impedance around 3fo and voltage peaking at transistor collector or drain improving further the power efficiency of the Doherty amplifier.

Figure 8:
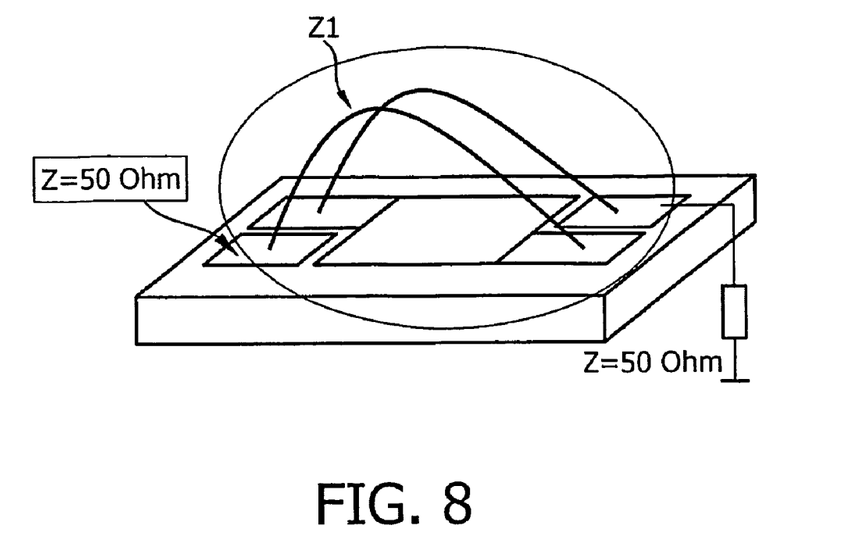
FIG. 8 shows a first implementation example of a lumped element equivalent of a λ/4 transmission line, according to the preferred embodiment.

FIG. 8 shows a first implementation example of the lumped element $\lambda/4$ transmission lines Z1 or Z2 which are adapted to have an input impedance of 50 Ohm corresponding to the load impedance ZL. According to FIG. 8, the lumped-element transmission lines Z1 and Z2 may be arranged in MMIC technology with bond wires and capacitors forming the actual transmission line. The use of bond lines provides the advantage of less power loss in the artificial line.

Figure 9:
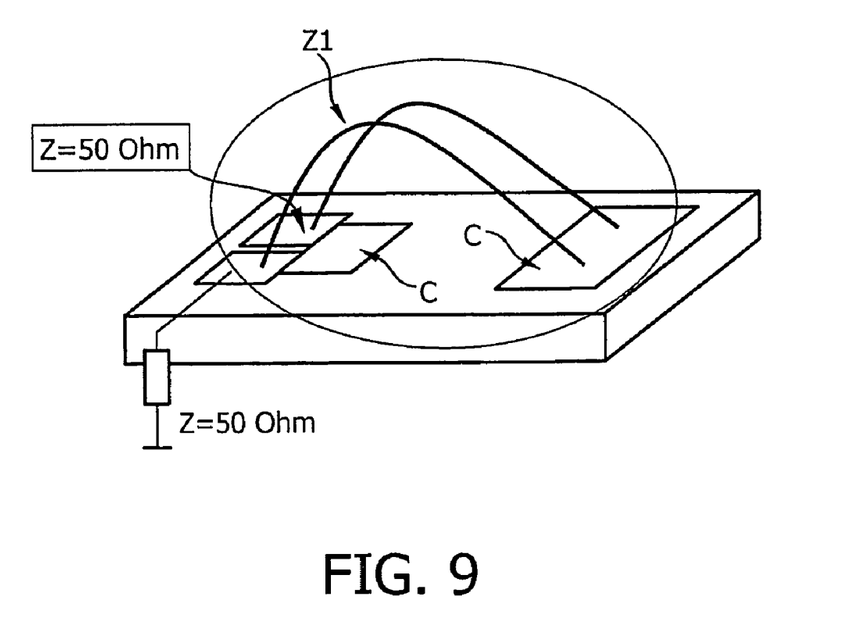
FIG. 9 shows a second implementation example of the lumped element equivalent of a λ/4 transmission line, according to the preferred embodiment.

FIG. 9 shows a second implementation example of the lumped element $\lambda/4$ transmission lines Z1 or Z2 which are adapted to have an input impedance of 50 Ohm corresponding to the load impedance ZL. According to FIG. 9, the implementation is modified to provide lower or no mutual coupling between the bond wires and easier implementation with less parasitic components. The reason for this is that input and output ports are both located at the same end (i.e. left end) of the circuit. In this second example, other capacitance and inductance values are required, which is suitable when the required inductance values become too low.

Figure 10:
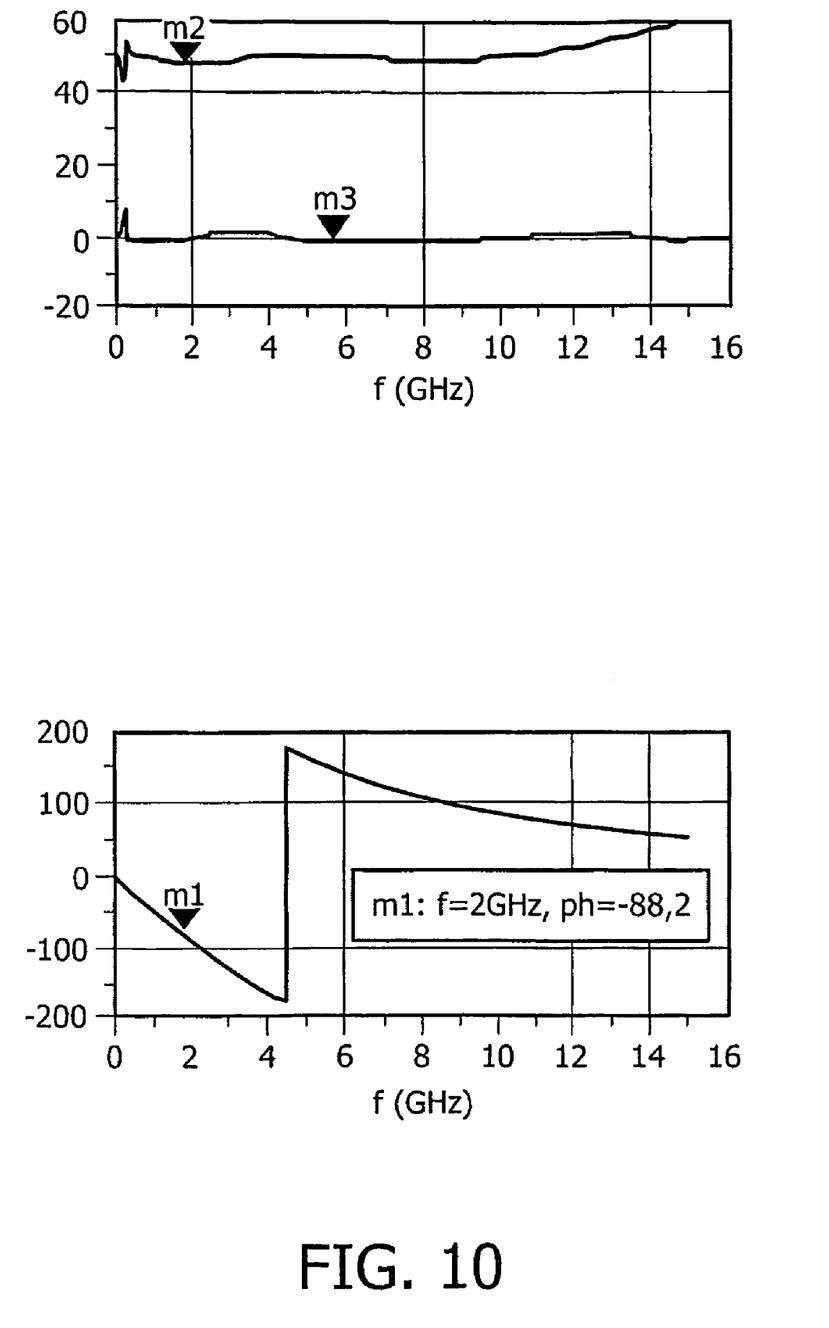
FIG. 10 shows impedance and phase diagrams of the lumped element equivalent of the λ/4 transmission line.

FIG. 10 shows characteristic impedance and phase diagrams corresponding to the lumped-element $\lambda/4$ transmission line of FIG. 8. In the upper diagram, the real and imaginary parts of the impedance are shown, where the upper line indicates the real part and the lower line indicates the imaginary part. In view of the fact that the imaginary part is substantially zero over the whole frequency range, the input impedance of the lumped element transmission line corresponds to an ohmic resistance substantially at 50 ohm. The lower phase diagram indicates a phase difference of about 90° at fundamental frequency fo of e.g. 2 GHz as indicated by the marker m1. The slope of the phase curve indicates the change of the phase difference between the output and the input of the lumped element transmission line in dependence on frequency changes, which is quite flat for this specific embodiment.

As an alternative, the lumped element $\lambda/4$ transmission line can be obtained by providing two serial connected inductors and a parallel capacitor which its connected between the junction point of the two serially connected inductors and the reference or ground potential. The series inductors and the parallel capacitor can be designed to consider any parasitic inductors and capacitors.

Figure 11:
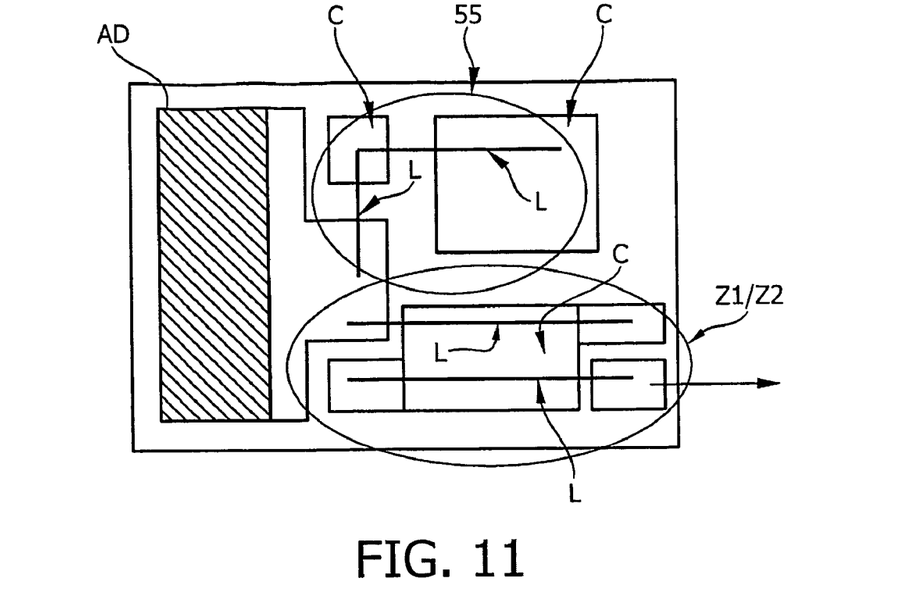
FIG. 11 shows an example of a one cell design of a power transistor with output matching circuitry according to the preferred embodiment.

FIG. 11 shows an example of a one cell design of a power transistor or power device with output matching structure for the main amplifier 20, including compensation and $\lambda/4$ transmission line circuitry, of the integrated Doherty type amplifier in MMIC technology. The hatched area indicates an active portion AD, while the bold straight lines indicate bond wires serving as inductors L and the plated areas indicate parallel capacitors C. Hence, the upper right portion of the cell design corresponds to the compensation circuit 55 of FIG. 6, while the lower right portion corresponds to the lumped element equivalent of the transmission lines Z1 or Z2. With this cell design, a simple and compact integration of the Doherty type amplifier arrangement can be obtained.

Figure 12:
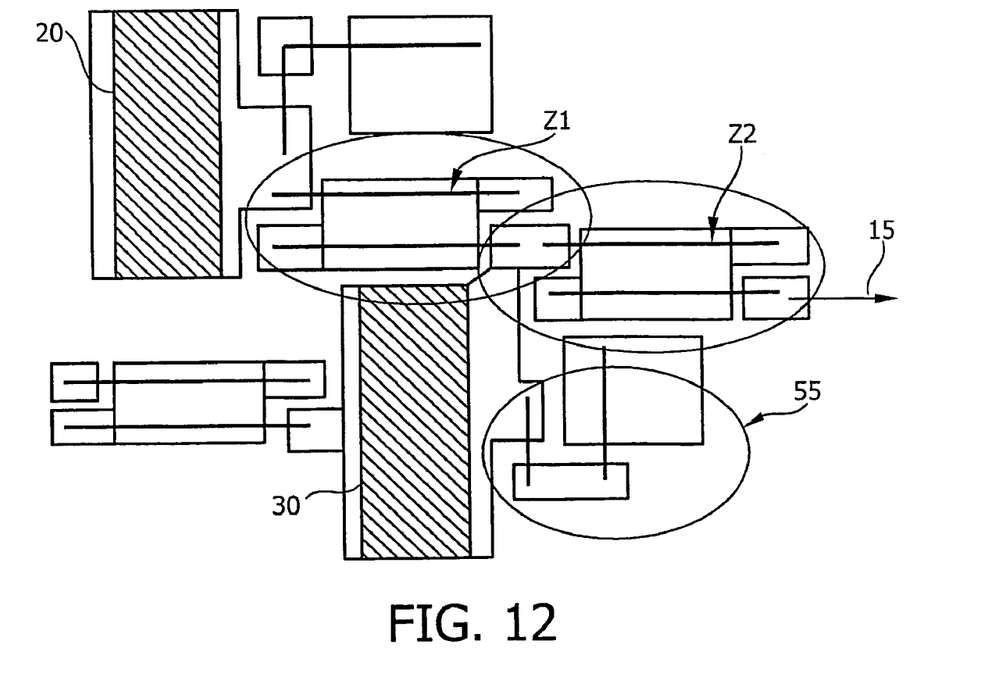
FIG. 12 shows a design example of a main and peak amplifier according to the preferred embodiment.

FIG. 12 shows a design example of the main amplifier 20 and the upper peak amplifier 30 of the integrated Doherty type amplifier with the proposed output matching circuitry. Here, the upper left hatched portion indicates the active die of the power device of the main amplifier 20, while the lower middle hatched portion indicates the active die of the power device of the first peak amplifier 30. Furthermore, the two lumped element artificial lines or transmission lines Z1 and Z2 are shown with the connection to the output port 15. The compensation circuit 55 of the first peak amplifier 30 is indicated in the lower right portion and basically corresponds to the respective compensation circuit of the main amplifier 20 as shown in the upper middle portion.

Accordingly, in connection with the improved power division input network and output compensation network, an enhanced Doherty type amplifier performance can be provided with high electrical isolation between peak and main amplifier input ports, high isolation between Doherty common input port and input ports of peak and main amplifiers at a wide band 90° phase difference between the two input signals applied to the main and peak amplifiers. A non-even power distribution can be provided between the input of the main and multiple peak amplifiers while maintaining the required 90° phase difference over the whole frequency band. The improved output circuit provides a wide range of characteristic impedance without impact on the required area. Thereby, AM-AM distortions due to variable output loading at the outputs of the Doherty type amplifier can be reduced. It is noted that, in general, any of the inductors used in the above preferred embodiment may be implemented or realized as a bond wire element to thereby ensure low power loss and compact size.

In summary, an integrated Doherty type amplifier arrangement and an amplifying method for such an arrangement is proposed, wherein a lumped element hybrid power divider 12 is provided for splitting input signals of main and peak amplifier stages 20, 30, 40 at predetermined phase shifts and non-equal division rates and at least one wideband lumped element artificial line Z1, Z2 combined with wideband compensation circuit for receiving said first amplified signal and for applying said predetermined phase shift to said first amplified signal and its higher harmonics. Thereby, the low gain of the peak amplifier is compensated by providing the non-equal power splitting at the input. Moreover, the use of the lumped element hybrid power divider leads to an improved isolation between the input ports of the main and peak amplifiers decreasing final distortions of the output signal.

It is to be noted that the present invention is not restricted to the above preferred embodiments, but can be used in any kind of single-stage or multiple-stage Doherty type amplifier arrangement. Furthermore, any other type of hybrid coupler or power divider which can be adapted to provide an non-equal or arbitrary power division can be used instead of the hybrid coupler shown in FIG. 3. The preferred embodiment may be used as a building block device for high power Doherty amplifiers when connected in parallel within a high power RF transistor package, for power levels above 100 W, for example.

It is further noted that the present invention is not limited to the above preferred embodiments and can be varied within the scope of the attached claims. In particular, the described drawing figures are only schematic and are not limiting. In the drawings, the size of some of the elements may be exaggerated and not drawn on scale for illustrative purposes. Where the term 'comprising' is used in the present description and claims, it does not exclude other elements or steps. Where an indefinite or definite article is used when referring to a singular noun, e.g. 'a' or 'an', 'the', this includes a plural of that noun unless something else is specifically stated. The terms first, second, third and the like in the description and in the claims are used for distinguishing between similar elements and not necessarily for describing a sequential or chronological order. It is to be understood that the embodiments of the invention described herein are capable of operation in other sequences than described or illustrated herein. Moreover, although preferred embodiments, specific constructions and configurations have been discussed herein, various changes or modifications in form and detail may be made without departing from the scope of the attached claims.

The invention claimed is:

1. An integrated Doherty type amplifier arrangement, comprising:
    a) a main amplifier stage for receiving a first signal and for amplifying the first signal to generate a first amplified signal;
    b) at least one peak amplifier stage for receiving at least one respective second signal, said peak amplifier stage being arranged to start operation when the level of that respective second signal has reached a predetermined threshold;
    c) at least one lumped element hybrid power divider means for splitting an input signal of said amplifier arrangement into said first and at least one second signals at predetermined phase shifts and at non-equal division rates; and
    d) at least one lumped element artificial line for receiving said first amplified signal and for applying said predetermined phase shift to said first amplified signal.

2. An amplifier arrangement according to claim 1, wherein said main and peak amplifier stages comprise at least one of bipolar elements, metal oxide semiconductors, LDMOST elements, field effect transistors, and HBT elements.

3. An amplifier arrangement according to claim 1 wherein said lumped element hybrid power divider means are built with bond wires or deposited inductances and capacitances.

4. An amplifier arrangement according to claim 1, wherein said main amplifier and peak amplifier stages comprise an output compensation circuit for compensating a parasitic output capacitance at fundamental frequency and least one odd multiple thereof.

5. An amplifier arrangement according to claim 4, wherein said output compensation circuit is adapted to provide a substantially reduced impedance at a frequency of at least one even multiple of said fundamental frequency.

6. An amplifier arrangement according to claim 4, wherein said output compensation circuit comprises two inductors and two capacitors or their equivalents.

7. An amplifier arrangement according to claim 6, wherein said inductors of said output compensation circuit are made at least partly of bond wires.

8. An amplifier arrangement according to claim 1, wherein said main and at least one peak amplifier stages are connected at their outputs via said lumped element artificial line which acts as a quarter wave length transmission line.

9. An amplifier arrangement according to claim 1, wherein said lumped element artificial line comprises two or more inductively coupled wires and one or more capacitors connected with its one end to a common point of two of said inductively coupled wires and with its other end to a reference potential.

10. An amplifier arrangement according to claim 1, wherein said lumped element hybrid power divider means is arranged to provide isolation between all ports at arbitrary power division and two substantially maintain said predetermined phase shift between said first and at least one second signal over a wide frequency range.

11. An amplifier arrangement according to claim 10, wherein said lumped element hybrid power divider means comprises at each input port a respective serial inductor and two first parallel capacitors connected to each other at their one ends via said serial inductor and connected at their other ends to a reference potential, and two second parallel capacitors respectively connecting the ends of said respective serial inductors.

* * * * *